US012745389B2

(12) United States Patent
Inden

(10) Patent No.: US 12,745,389 B2
(45) Date of Patent: Sep. 22, 2026

(54) SEMICONDUCTOR DEVICE, METHOD OF MANUFACTURING SEMICONDUCTOR DEVICE, AND SEMICONDUCTOR MEMORY DEVICE

(71) Applicant: Kioxia Corporation, Tokyo (JP)

(72) Inventor: Tomoya Inden, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 731 days.

(21) Appl. No.: 18/180,596

(22) Filed: Mar. 8, 2023

(65) Prior Publication Data

US 2023/0225121 A1 Jul. 13, 2023

Related U.S. Application Data

(63) Continuation of application No. PCT/JP2020/035504, filed on Sep. 18, 2020.

(51) Int. Cl.

*H10B 43/27* (2023.01)
*H10B 41/27* (2023.01)
*H10B 41/35* (2023.01)
*H10B 41/41* (2023.01)

(Continued)

(52) U.S. Cl.

CPC ............. *H10B 41/41* (2023.02); *H10B 41/27* (2023.02); *H10B 41/35* (2023.02); *H10B 43/27* (2023.02); *H10B 43/35* (2023.02); *H10B 43/40* (2023.02)

(58) Field of Classification Search

CPC ................................ H10B 43/40; H10B 41/40
See application file for complete search history.

(56) References Cited

U.S. PATENT DOCUMENTS 5,796,151 A * 8/1998 Hsu .................... H01L 21/28512 257/411
9,406,694 B1 8/2016 Ikeno et al.
9,842,845 B1 * 12/2017 Melde ............... H01L 21/31111

(Continued)

FOREIGN PATENT DOCUMENTS

JP 10-189974 A 7/1998
JP 2004-303799 A 10/2004

(Continued)

OTHER PUBLICATIONS

International Search Report issued Dec. 15, 2020 in PCT/JP2020/035504 filed Sep. 18, 2020, 3 pages.

*Primary Examiner* — Christopher A Johnson
(74) *Attorney, Agent, or Firm* — Oblon, McClelland, Maier & Neustadt, L.L.P.

(57) ABSTRACT

A semiconductor device includes a semiconductor substrate having a first region and a second region; a first insulating layer; a first gate electrode having a first semiconductor layer containing an impurity, a first conductive layer containing titanium, a second conductive layer containing nitrogen and either titanium or tungsten, and a third conductive layer containing tungsten; a second insulating layer provided on the third conductive layer and containing oxygen and silicon; a third insulating layer provided on the second insulating layer and containing nitrogen and silicon; a first contact provided on the first region; a second contact provided on the second region; and a third contact provided on the third conductive layer of the first gate electrode and penetrating through the second insulating layer and the third insulating layer.

9 Claims, 12 Drawing Sheets

(51) Int. Cl.

| | |
|---|---|
| ***H10B 43/35*** | (2023.01) |
| ***H10B 43/40*** | (2023.01) |

(56) References Cited

U.S. PATENT DOCUMENTS

| | | | | |
|---|---|---|---|---|
| 2001/0035557 | A1* | 11/2001 | Park | H10D 84/859 438/228 |
| 2002/0030234 | A1 | 3/2002 | Ohuchi et al. | |
| 2004/0266151 | A1 | 12/2004 | Lim et al. | |
| 2008/0157383 | A1* | 7/2008 | Lim | H10D 30/6891 257/E21.2 |
| 2019/0267229 | A1 | 8/2019 | Isogai et al. | |
| 2021/0225870 | A1* | 7/2021 | Yang | H10B 43/40 |

FOREIGN PATENT DOCUMENTS

| | | | |
|---|---|---|---|
| JP | 2004-363430 | A | 12/2004 |
| JP | 2006-49779 | A | 2/2006 |
| JP | 2008-166797 | A | 7/2008 |
| JP | 2013-42019 | A | 2/2013 |
| JP | 2016-225434 | A | 12/2016 |
| JP | 2019-149531 | A | 9/2019 |

* cited by examiner

TrN FORMATION REGION
TrP FORMATION REGION
31
2
P-Well
N-Well
10
STI
PW
STI
NW
STI
Z
X
Y TrN FORMATION REGION
TrP FORMATION REGION
31b
31a
2
P-Well
N-Well
10
STI
PW
STI
NW
STI
Z
X
Y TrN FORMATION REGION
TrP FORMATION REGION
5
4
34
33
32
31b
31a
2
P-Well
N-Well
10
STI
PW
STI
NW
STI
Z
Y
X PERIPHERAL CIRCUIT
MEMORY CELL ARRAY
232
234
233
235
231
236
261(BL)
252
222
203
221(SGDT0)
D0
C0
CS
222
214
221(SGSB0)
10
Z
X
Y
TrN
TrP

SEMICONDUCTOR DEVICE, METHOD OF MANUFACTURING SEMICONDUCTOR DEVICE, AND SEMICONDUCTOR MEMORY DEVICE

CROSS-REFERENCE TO RELATED APPLICATIONS

This application is a continuation application of International Application No. PCT/JP2020/035504 filed on Sep. 18, 2020; the entire contents of which are incorporated herein by reference.

FIELD

Embodiments described herein relate generally to a semiconductor device, a method of manufacturing the semiconductor device, and a semiconductor memory device.

BACKGROUND

In recent years, known examples of a semiconductor memory device have a peripheral circuit and a memory cell array, the peripheral circuit having a field-effect transistor.

DETAILED DESCRIPTION

Figure 1:
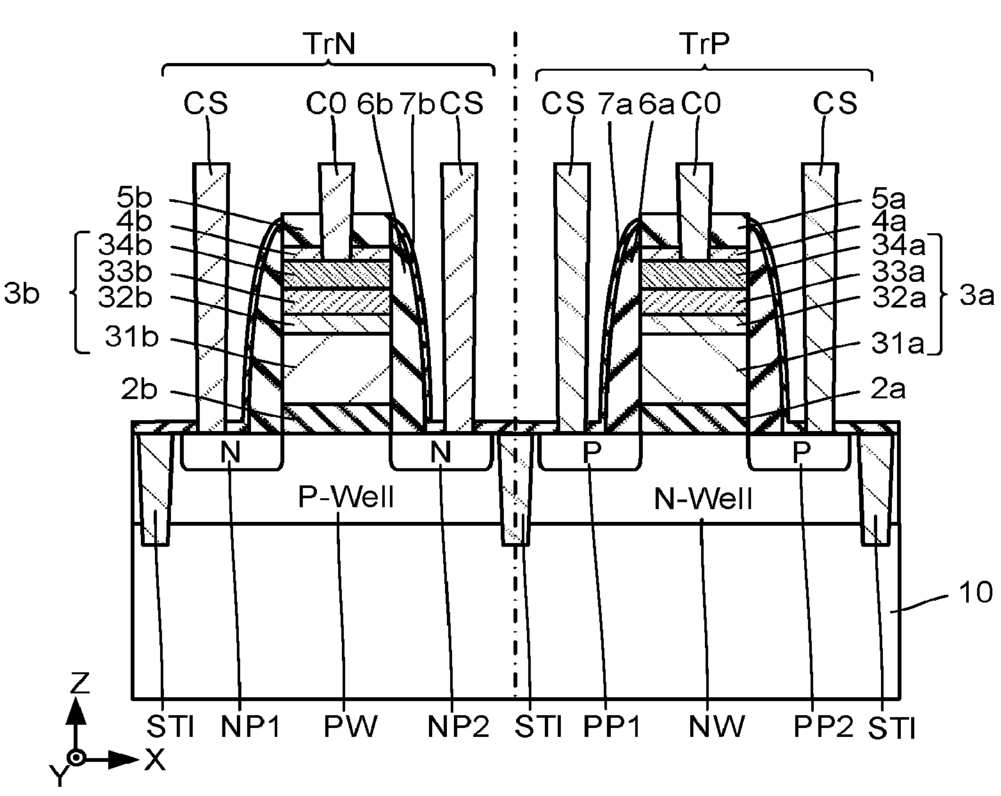
FIG. 1 is a cross-sectional schematic diagram illustrating a structural example of a semiconductor device.

A semiconductor device of the embodiment includes: a semiconductor substrate (10) having a first region (NP1) and a second region (NP2), each region containing a first-type impurity; a first insulating layer (2*b*) provided on a region between the first region and the second region in the semiconductor substrate; a first gate electrode (3*b*) having a first semiconductor layer (31*b*) provided on the first insulating layer and containing an impurity, a first conductive layer (32*b*) provided on the first semiconductor layer and containing titanium, a second conductive layer (33*b*) provided on the first conductive layer and containing nitrogen and either titanium or tungsten, and a third conductive layer (34*b*) provided on the second conductive layer and containing tungsten; a second insulating layer (4*b*) provided on the third conductive layer and containing oxygen and silicon; a third insulating layer (5*b*) provided on the second insulating layer and containing nitrogen and silicon; a first contact (CS) provided on the first region; a second contact (CS) provided on the second region; and a third contact (C0) provided on the third conductive layer of the first gate electrode, the third contact penetrating through the second insulating layer and the third insulating layer.

Hereinafter, embodiments will be described with reference to the drawings. A relationship between a thickness and a planar size of each component, a thickness proportion of each component, and the like illustrated in the drawings are sometimes different from actual ones. In each embodiment presented below, substantially the same components are represented by the same reference numerals, and a description thereof is sometimes partially omitted.

First Embodiment

A structural example of a semiconductor device of this embodiment is described below. FIG. 1 is a cross-sectional schematic diagram illustrating a structural example of the semiconductor device, illustrating an X-axis, a Y-axis that intersects the X-axis almost perpendicularly, and a Z-axis that intersects each of the X and Y axes almost perpendicularly, as well as part of an X-Z cross-section.

The semiconductor device illustrated in FIG. 1 includes field-effect transistors TrN and TrP. For convenience, FIG. 1 illustrates the field-effect transistors TrN and TrP adjacent to each other, but the arrangement is not limited thereto. For example, the field-effect transistors TrN and TrP may be arranged apart from each other and other transistors or the like may be provided between them.

A region where the field-effect transistor TrN is formed and a region where the field-effect transistor TrP is formed may be sometimes denoted as a TrN formation region and a TrP formation region, respectively.

The field-effect transistors TrN and TrP are ultra-low withstand voltage transistors intended for high-speed operation and applicable, for example, to logic circuits capable of low-voltage drive and high-speed operation. Without being limited thereto, examples of the field-effect transistor TrN may further include an ultra-high withstand voltage transistor capable of high voltage drive, a high withstand voltage transistor with lower withstand voltage than the ultra-high withstand voltage transistor, and other transistors. As an example, this embodiment describes an example in which the field-effect transistors TrN and TrP are the ultra-low withstand voltage transistors.

The field-effect transistor TrP is provided in an N-type well region NW. The field-effect transistor TrN is provided in a P-type well region PW. The N-type well region NW and the P-type well region PW are electrically isolated by an isolation region STI. The isolation region STI contains oxygen and silicon. The isolation region STI contains, for example, silicon oxide. The N-type well region NW, the P-type well region PW, and the isolation region STI face on a surface of a semiconductor substrate 10.

The field-effect transistor TrP includes a p-type impurity diffusion region PP1, a p-type impurity diffusion region PP2, an insulating layer 2*a*, a gate electrode 3*a*, an insulating layer 4*a*, an insulating layer 5*a*, an insulating layer 6*a*, and an insulating layer 7*a*.

The field-effect transistor TrN includes an n-type impurity diffusion region NP1, an n-type impurity diffusion region NP2, an insulating layer 2*b*, a gate electrode 3*b*, an insulating layer 4*b*, an insulating layer 5*b*, an insulating layer 6*b*, and an insulating layer 7*b*.

The semiconductor device illustrated in FIG. 1 further includes contact plugs CS and contact plugs C0. The contact plugs CS are conductive layers connected to sources or drains of the field-effect transistors TrP and TrN. The contact plugs C0 are conductive layers connected to the gate electrodes of the field-effect transistors TrP and TrN. Each of the p-type impurity diffusion regions PP1 and PP2, and the n-type impurity diffusion regions NP1 and NP2 is electrically connected to a different conductive layer through the contact plugs CS provided thereon. Each of the gate electrodes 3*a* and 3*b* is electrically connected to a different conductive layer through the contact plug C0 provided thereon.

The p-type impurity diffusion regions PP1 and PP2 are formed on an upper surface (near the surface) of the N-type well region NW and contain doped boron (B), for example. The p-type impurity diffusion region PP1 is arranged to be apart from the p-type impurity diffusion region PP2 in the X-axis direction.

The p-type impurity diffusion regions PP1 and PP2 function as a source (source diffusion layer) and a drain (drain diffusion layer) of the field-effect transistor TrP.

The n-type impurity diffusion regions NP1 and NP2 are formed on an upper surface (near the surface) of the P-type well region PW and contain doped phosphorus (P), for example. The n-type impurity diffusion region NP1 is arranged to be apart from the n-type impurity diffusion region NP2 in the X-axis direction.

The n-type impurity diffusion regions NP1 and NP2 function as a source (source diffusion layer) and a drain (drain diffusion layer) of the field-effect transistor TrN.

The insulating layer 2*a* is provided on the N-type well region NW between the p-type impurity diffusion regions PP1 and PP2 and functions as a gate insulating film of the field-effect transistor TrP.

The insulating layer 2*b* is provided on the N-type well region NW between the n-type impurity diffusion regions NP1 and NP2 and functions as a gate insulating film of the field-effect transistor TrN.

The insulating layers 2*a* and 2*b* contain insulating materials. The insulating materials include silicon and either oxygen or nitrogen. Examples of the insulating materials include silicon oxide, silicon nitride, and the like.

The gate electrode 3*a* is provided on the insulating layer 2*a*. The gate electrode 3*a* includes a semiconductor layer 31*a*, a conductive layer 32*a*, a conductive layer 33*a*, and a conductive layer 34*a*.

The gate electrode 3*b* is provided on the insulating layer 2*b*. The gate electrode 3*b* includes a semiconductor layer 31*b*, a conductive layer 32*b*, a conductive layer 33*b*, and a conductive layer 34*b*.

The semiconductor layers 31*a* and 31*b* are provided on the insulating layers 2*a* and 2*b*, respectively. Examples of the semiconductor layer 31*a* include a polysilicon layer doped with impurities such as boron (B). Examples of the semiconductor layer 31*b* include a polysilicon layer doped with impurities such as phosphorus (P). The presence of the impurities such as boron or phosphorus in the semiconductor layers 31*a* and 31*b*, can adjust threshold voltages of the field-effect transistors TrP and TrN.

The conductive layers 32*a* and 32*b* are provided on the semiconductor layers 31*a* and 31*b*, respectively. The conductive layers 32*a* and 32*b* contain, for example, titanium (Ti).

The conductive layers 33*a* and 33*b* are provided on the conductive layers 32*a* and 32*b*, respectively. The conductive layers 33*a* and 33*b* contain nitrogen and either titanium or tungsten. The conductive layers 33*a* and 33*b* contain, for example, titanium nitride (TiN) or tungsten nitride (WN).

The conductive layers 34*a* and 34*b* are provided on the conductive layers 33*a* and 33*b*, respectively. The conductive layers 34*a* and 34*b* contain, for example, tungsten (W).

The insulating layers 4*a* and 4*b* are provided on the conductive layers 34*a* and 34*b*, respectively. The insulating layers 4*a* and 4*b* contain oxygen and silicon. The insulating layers 4*a* and 4*b* contain, for example, silicon oxide.

The insulating layers 4*a* and 4*b* are each a silicon oxide film formed by oxidizing a raw material containing silicon at a temperature of 350° C. or less, for example. The oxide film formed by the above oxidation is also referred to as a low-temperature oxide film (LTO film). The silicon oxide film, which is the LTO film, is preferred because it can prevent abnormal oxidation of a conductive film 34. A natural oxide film is not included in the LTO film.

The insulating layers 4*a* and 4*b* are preferably thinner than the insulating layers 5*a* and 5*b*, respectively. A thickness of each of the insulating layers 4*a* and 4*b* is 5 nm or less. A decrease of the thickness of the insulating layer 4*a* can prevent an increase in connection resistance between the gate electrode 3*a* and the contact plug C0. A decrease of the thickness of the insulating layer 4*b* can prevent an increase in connection resistance between the gate electrode 3*b* and the contact plug C0.

The insulating layers 5*a* and 5*b* are provided on the insulating layers 4*a* and 4*b*, respectively. The insulating layers 5*a* and 5*b* contain nitrogen and silicon. The insulating layers 5*a* and 5*b* contain, for example, silicon nitride. The insulating layers 5*a* and 5*b* function, for example, as etching stoppers when forming the contact plugs C0. One of the contact plugs C0 is provided on the conductive layer 34*a* and penetrates through the insulating layers 4*a* and 5*a*. Another of the contact plugs C0 is provided on the conductive layer 34*b* and penetrates through the insulating layers 4*b* and 5*b*.

The insulating layer 6*a* is provided on a side of a stack of the insulating layer 2*a*, the gate electrode 3*a*, the insulating layer 4*a*, and the insulating layer 5*a*. The insulating layer 6*b* is provided on a side of a stack of the insulating layer 2*b*, the gate electrode 3*b*, the insulating layer 4*b*, and the insulating layer 5*b*. The insulating layers 6*a* and 6*b* contain, for example, oxygen and silicon. The insulating layers 6*a* and 6*b* contain, for example, silicon oxide. The insulating layers 6*a* and 6*b* function as sidewalls for the field-effect transistors TrP and TrN, respectively.

The insulating layer 7*a* is provided on the insulating layer 6*a*. The insulating layer 7*b* is provided on the insulating layer 6*b*. The insulating layers 7*a* and 7*b* contain nitrogen and silicon. The insulating layers 7*a* and 7*b* contain silicon nitride. The insulating layers 7*a* and 7*b* function as sidewalls for the field-effect transistors TrP and TrN, respectively.

Figure 2:
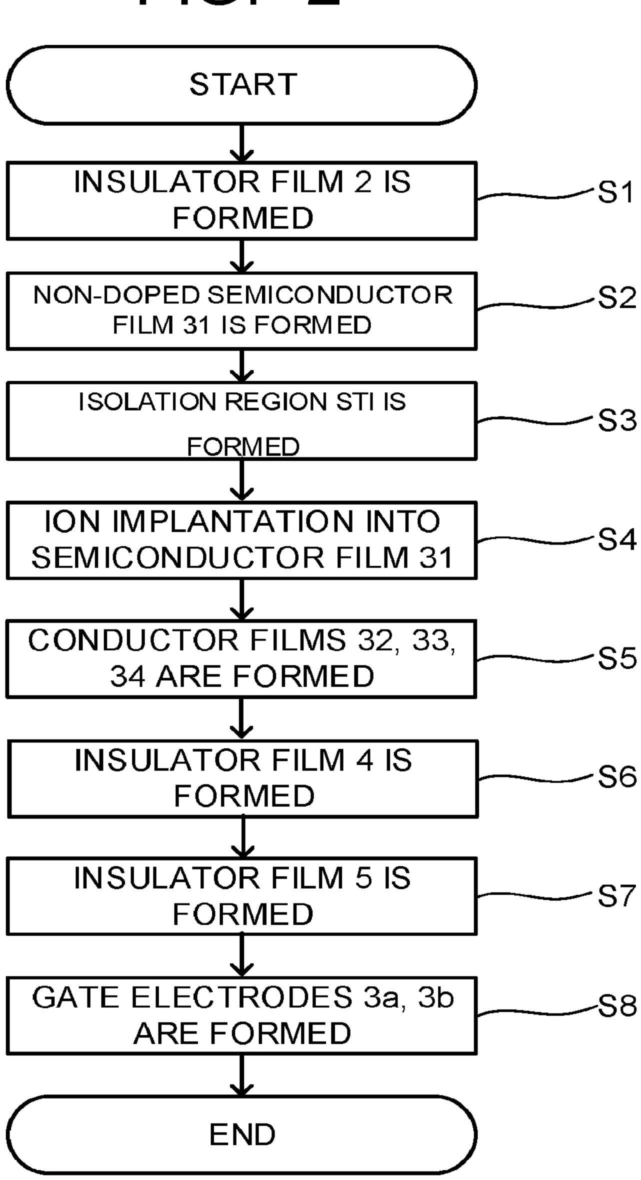
FIG. 2 is a flowchart for describing an example of a method of manufacturing the semiconductor device.

Next, an example of a series of processes in forming the gate electrode of the field-effect transistor in the semiconductor device illustrated in FIG. 1 will be described with appropriate reference to FIG. 2. FIG. 2 is a flowchart for describing an example of a method of manufacturing the semiconductor device. FIG. 3 to FIG. 10 each illustrate an example of a cross-sectional structure of the semiconductor device in the process of manufacturing and illustrate the cross-section similar to FIG. 1.

For example, when an insulating film 4 is provided over all of the TrP and TrN formation regions, the insulating film 4 in the TrP and TrN formation regions may be sometimes referred to as the insulating layers 4*a* and 4*b*, respectively. In other words, when describing all of the insulating layers 4*a* and 4*b*, a common reference numeral such as the "insulating film 4" is used. This method of description is also used for other reference numerals throughout this specification.

Figure 3:
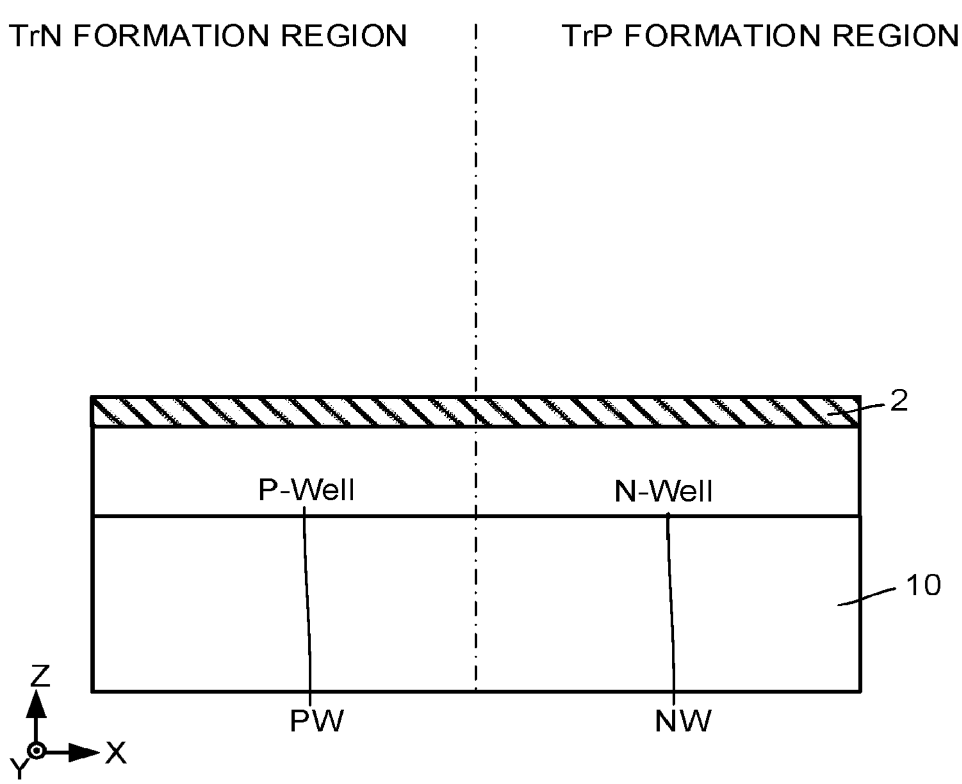
FIG. 3 is a diagram illustrating an example of a cross-sectional structure of the semiconductor device in a process of manufacturing.

First, as illustrated in FIG. 3, an insulating film 2 is formed on the semiconductor substrate 10 (step S1).

Figure 4:
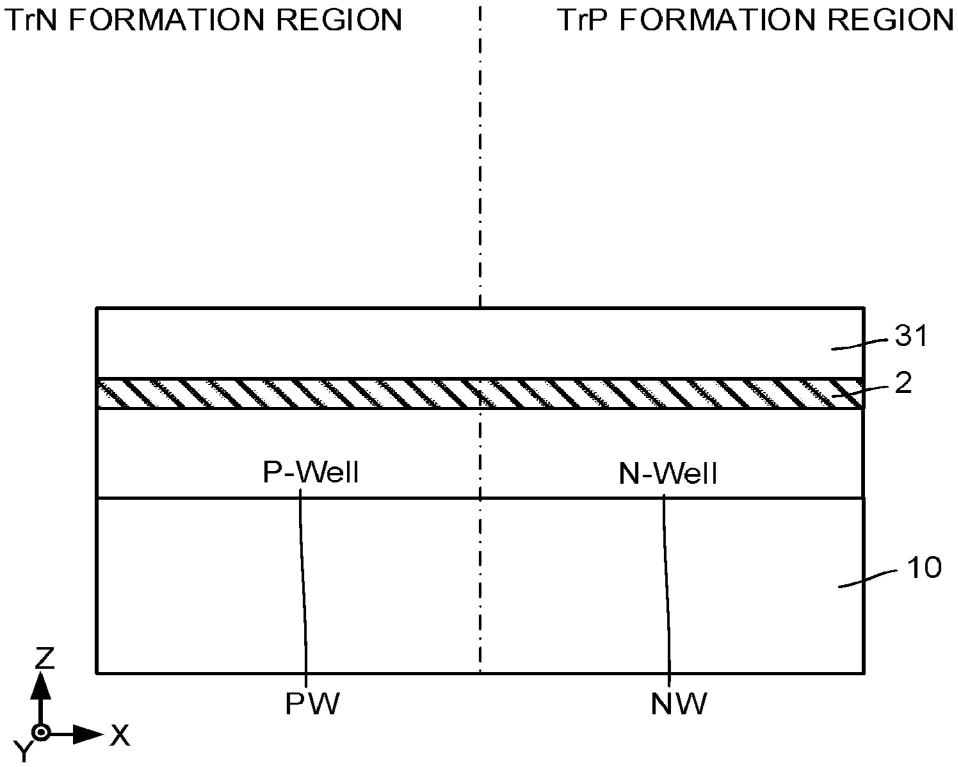
FIG. 4 is a diagram illustrating an example of a cross-sectional structure of the semiconductor device in the process of manufacturing.

Next, as illustrated in FIG. 4, a semiconductor film 31 is formed on the insulating film 2 (step S2). The semiconductor film 31 can be formed by depositing non-doped polysilicon, for example.

Figure 5:
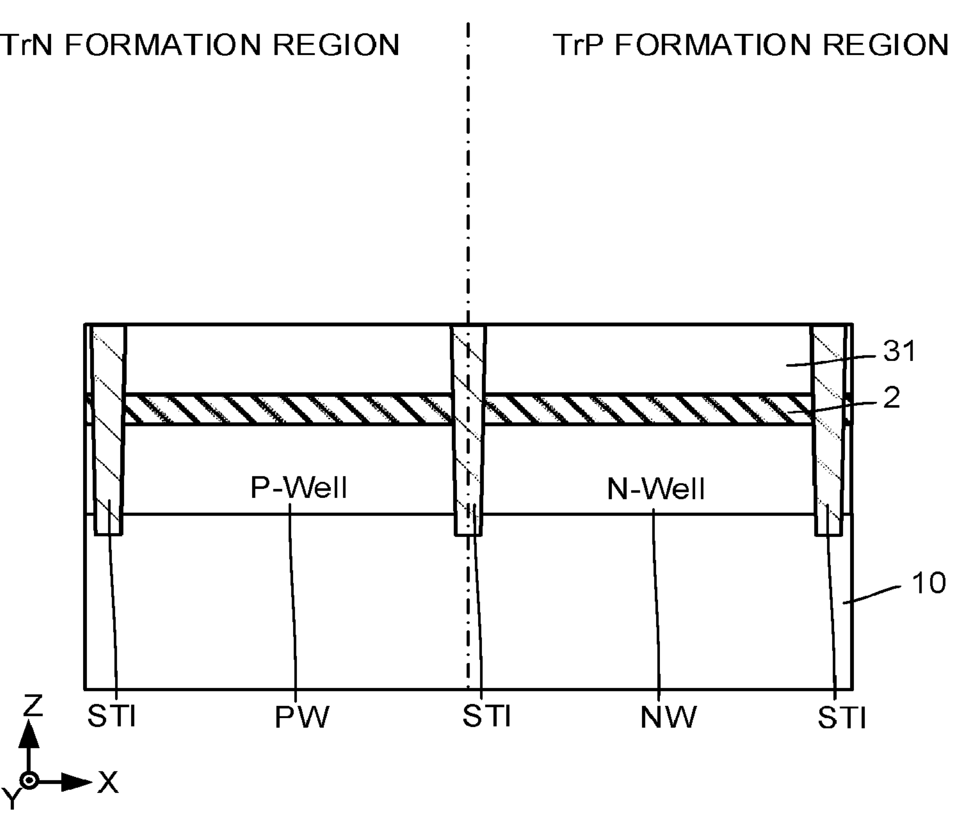
FIG. 5 is a diagram illustrating an example of a cross-sectional structure of the semiconductor device in the process of manufacturing.

Next, as illustrated in FIG. 5, isolation regions STI are formed (step S3). Concretely, regions, where the isolation regions STI are formed, are removed by, for example, a lithography process and etching, and an insulating material is embedded in the removed regions. The etching in this process is, for example, RIE (reactive ion etching). The isolation region STI is formed to isolate the layers that have been formed so far into the TrP formation region and the TrN formation region.

Figure 6:
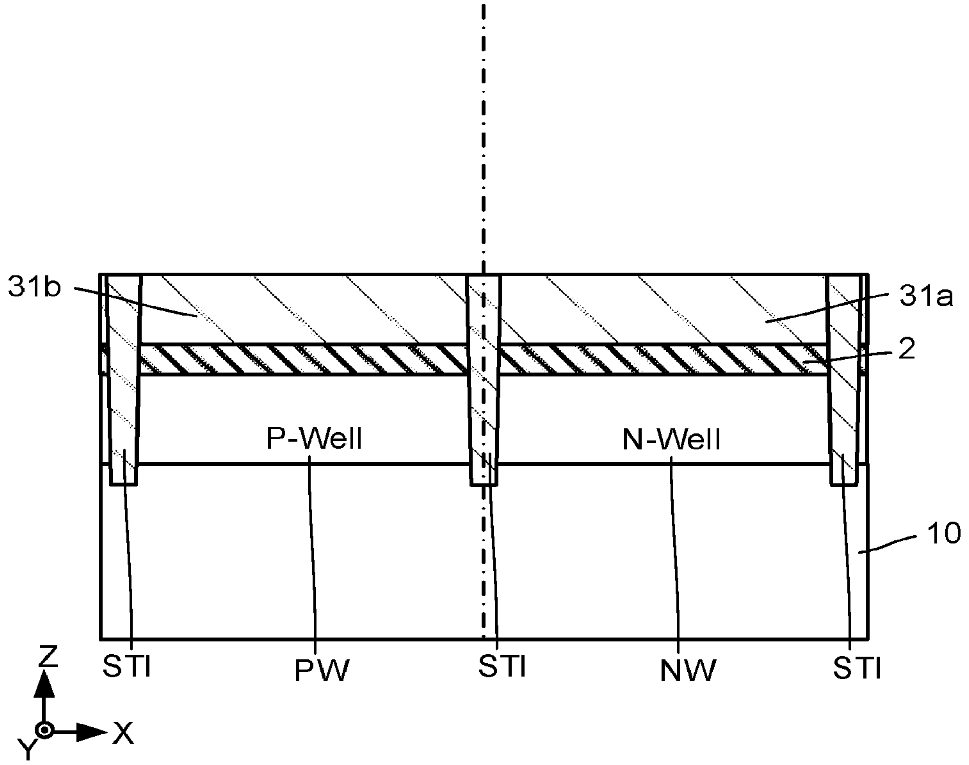
FIG. 6 is a diagram illustrating an example of a cross-sectional structure of the semiconductor device in the process of manufacturing.

Next, the semiconductor layers 31*a* and 31*b* are formed as illustrated in FIG. 6 (Step S4). Concretely, the semiconductor layer 31*a* is formed by doping boron into a part of the semiconductor film 31 by ion implantation while the TrN formation region is covered by a mask. The semiconductor layer 31*b* is formed by doping phosphorus into another part of the semiconductor film 31 by ion implantation while the TrP formation region is covered by a mask.

Figure 7:
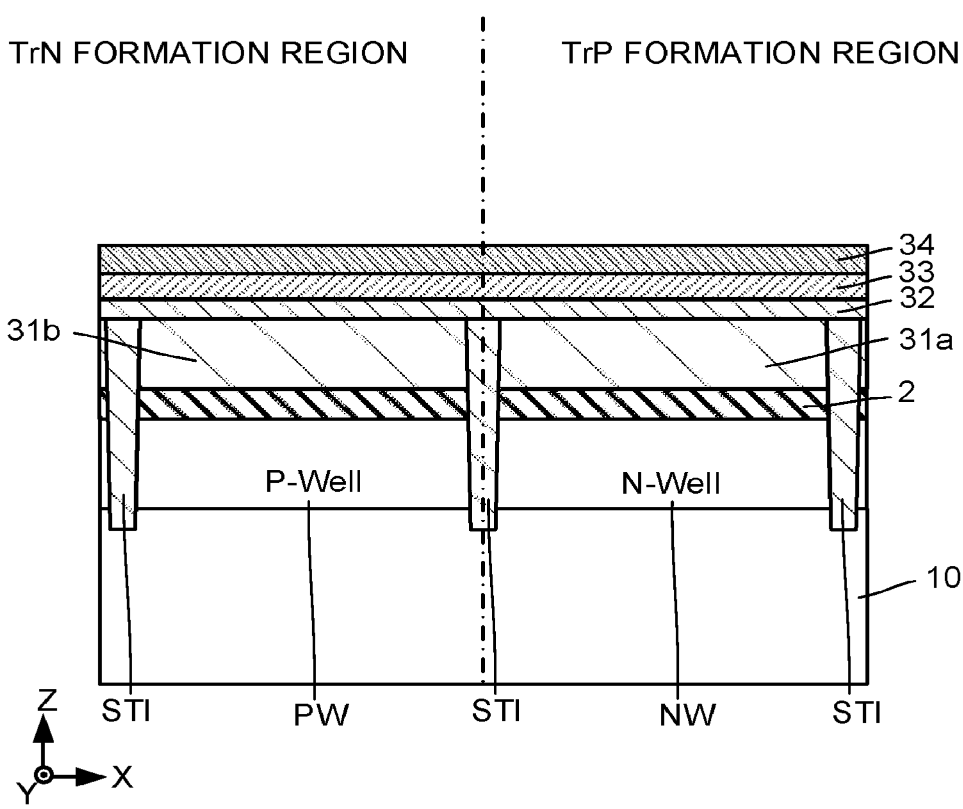
FIG. 7 is a diagram illustrating an example of a cross-sectional structure of the semiconductor device in the process of manufacturing.

Next, as illustrated in FIG. 7, a conductive film 32, a conductive film 33, and the conductive film 34 are formed (step S5). Concretely, the conductive film 32 is formed over the semiconductor layer 31*a*, the semiconductor layer 31*b*, and the isolation regions STI, the conductive film 33 is formed on the conductive film 32, and the conductive film 34 is formed on the conductive film 33.

Figure 8:
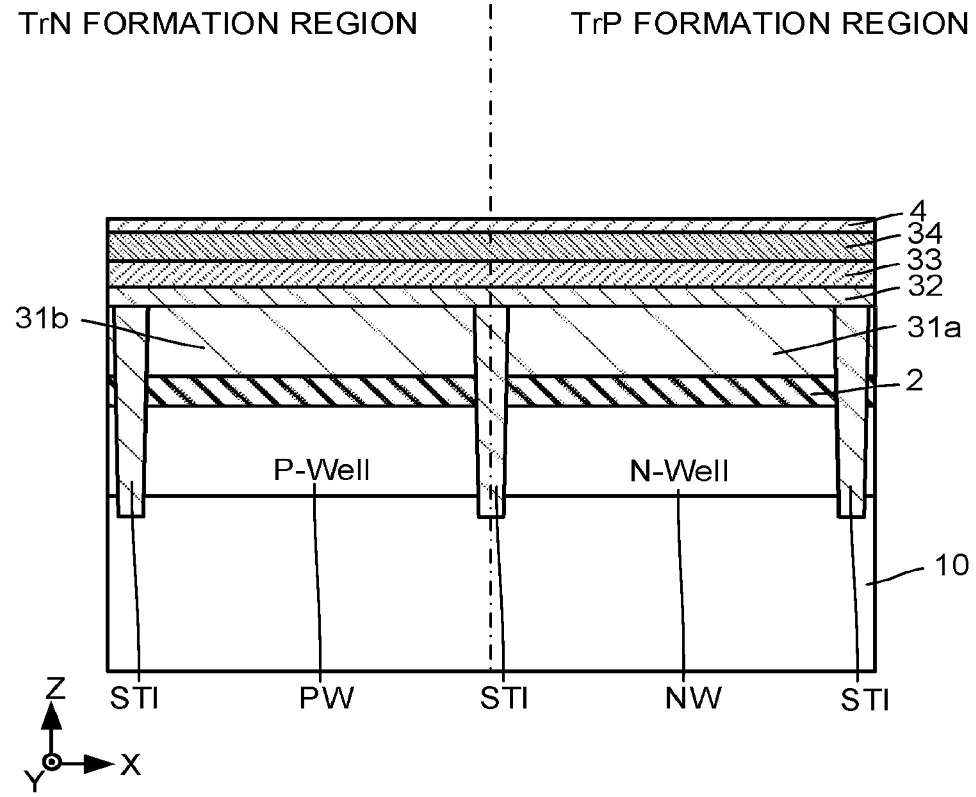
FIG. 8 is a diagram illustrating an example of a cross-sectional structure of the semiconductor device in the process of manufacturing.

Next, the insulating film 4 is formed (step S6), as illustrated in FIG. 8. Concretely, the insulating film 4 is formed on the conductive film 34. The insulating film 4 is formed by oxidizing a raw material containing silicon at a temperature of 350° C. or less, for example.

Figures 9, 10:
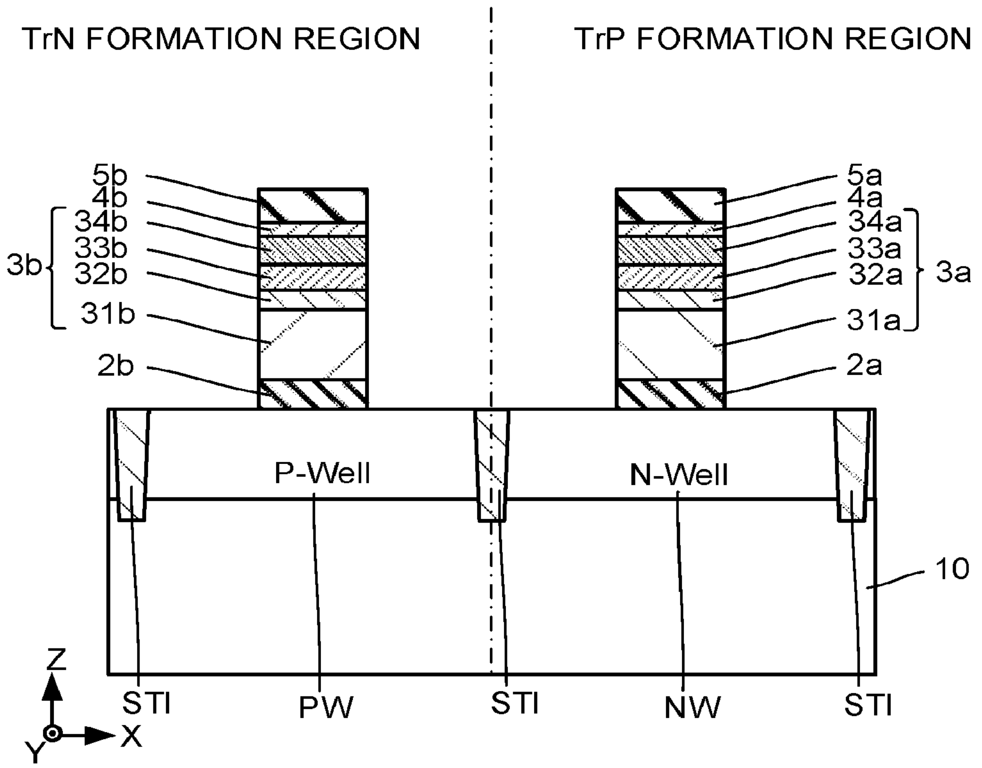
FIG. 9 is a diagram illustrating an example of a cross-sectional structure of the semiconductor device in the process of manufacturing.
FIG. 10 is a diagram illustrating an example of a cross-sectional structure of the semiconductor device in the process of manufacturing.

Next, an insulating film 5 is formed (step S7), as illustrated in FIG. 9. Concretely, the insulating film 5 is formed on the insulating film 4. The insulating film 5 is formed by depositing silicon nitride in an ammonia ($NH_3$) atmosphere by low-pressure plasma chemical vapor deposition method (LP-CVD) using dichlorosilane ($SiH_2Cl_2$: DCS), for example.

Next, the gate electrodes 3*a* and 3*b* are formed (step S8), as illustrated in FIG. 10. Concretely, parts of the isolation regions STI and portions around the isolation regions STI from among the layers stacked above the semiconductor substrate 10 are removed by etching. The layers stacked above the semiconductor substrate 10 are isolated by the TrP formation region and the TrN formation region. As a result of these processes, the insulating layer 2*a*, the insulating layer 2*b*, the conductive layer 32*a*, the conductive layer 32*b*, the conductive layer 33*a*, the conductive layer 33*b*, the conductive layer 34*a*, the conductive layer 34*b*, the insulating layer 4*a*, the insulating layer 4*b*, the insulating layer 5*a*, and the insulating layer 5*b* are formed. Etching in this process is, for example, RIE, and RIE may be performed multiple times.

Next, as illustrated in FIG. 1, the n-type impurity diffusion region NP1, the n-type impurity diffusion region NP2, the p-type impurity diffusion region PP1, the p-type impurity diffusion region PP2, the insulating layer 6*a*, the insulating layer 6*b*, the insulating layer 7*a*, the insulating layer 7*b*, the contact plugs CS, and the contact plugs C0 are formed.

The manufacturing process described above is only an example, other processes may be inserted between the manufacturing processes, and an order of the manufacturing processes may be interchanged to the extent that it does not cause problems.

The semiconductor device described above can prevent degradation of electric properties of a field-effect transistor and to achieve high reliability of a semiconductor device.

Figure 11:
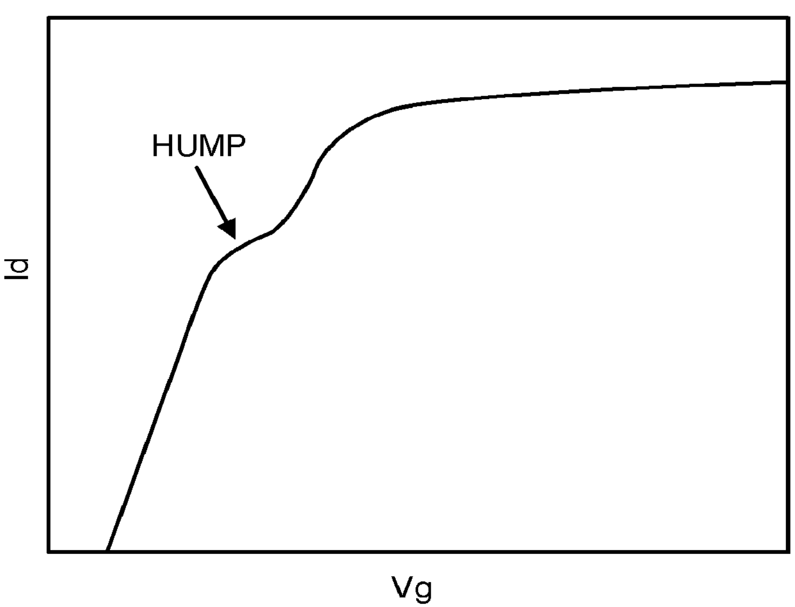
FIG. 11 is a graphic chart for describing degradation of electric properties of a field-effect transistor.

FIG. 11 is a graphic chart for describing degradation of electric properties of a field-effect transistor. As illustrated in FIG. 11, a field-effect transistor with a gate electrode having a stacked structure of a titanium layer/metal nitride layer/tungsten layer has a hump in a drain current (Id)-gate voltage (Vg) curve, which represents sub-threshold characteristics of the field-effect transistor, and a threshold voltage may vary significantly within a plane. Furthermore, the hump can cause large variations in the threshold voltage even when the same channel width is used when measuring a change in the threshold voltage due to a narrow channel effect.

Figure 12:
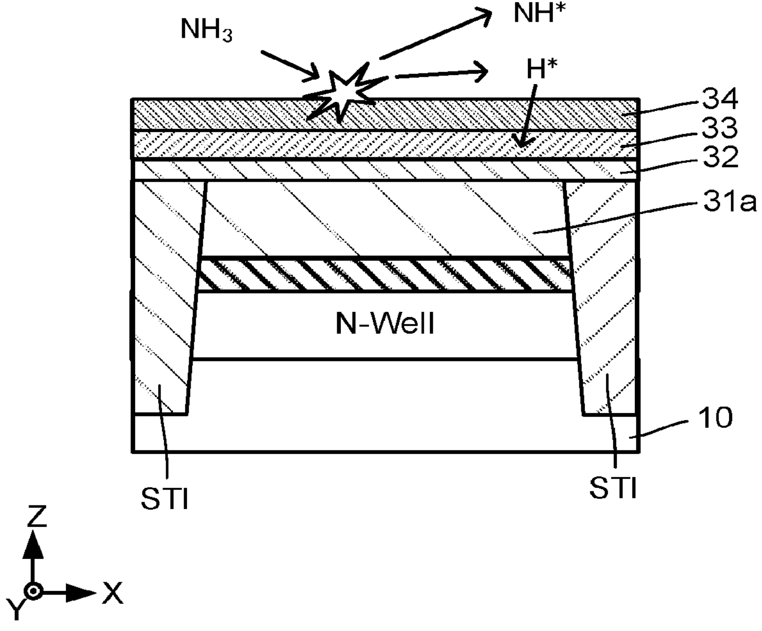
FIG. 12 is a schematic diagram for describing behavior of hydrogen in a manufacturing process of the semiconductor device.
Figure 13:
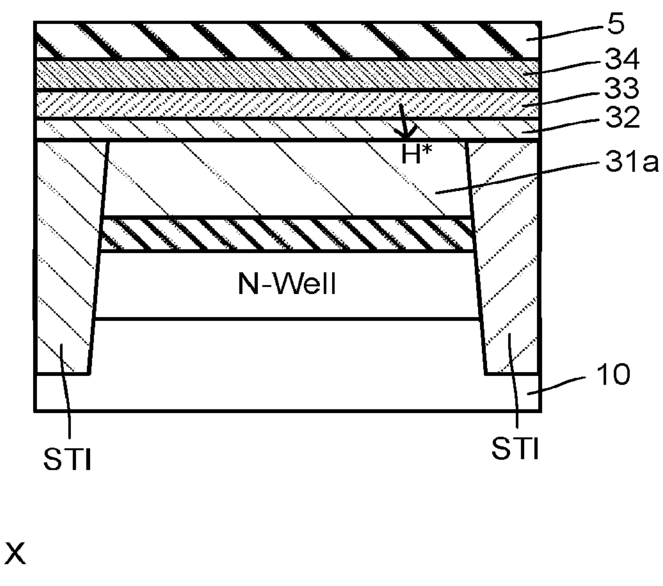
FIG. 13 is a schematic diagram for describing the behavior of hydrogen in the manufacturing process of the semiconductor device.

These variations in the threshold voltage are thought to be caused, for example, by hydrogen generated in the manufacturing process of the semiconductor device. FIG. 12 and FIG. 13 are schematic diagrams for describing behavior of hydrogen in the manufacturing process of the semiconductor device. Although FIG. 12 and FIG. 13 illustrate a part of the TrP region as an example, the same behavior is considered to be observed in the TrN region.

The insulating film 5 is formed by depositing silicon nitride in the ammonia atmosphere by LP-CVD using dichlorosilane, as described above.

When the insulating film 5 is formed directly on the conductive film 34, ammonia molecules ($NH_3$) flying to a surface of the conductive film 34 are decomposed by catalytic action of tungsten contained in the conductive film 34 to generate hydrogen (H*), as illustrated in FIG. 12. The generated H* is occluded by at least one of the conductive films 32 and 33.

Furthermore, the insulating film 5 is heated during film formation. This heating causes the occluded hydrogen to move to the semiconductor substrate 10, as illustrated in FIG. 13. Boron is injected into a region of the semiconductor substrate 10 facing on the isolation region STI mainly to prevent leakage current between elements. In particular, when the boron is injected at a boundary between the N-type well region NW or P-type well region PW and the isolation region STI and the injected boron is inert due to hydrogen, a low threshold voltage region is formed only at an edge of each well region, causing a corner current. When the corner current reaches a certain current, the Id-Vg curve forms an inflection point. This inflection point forms a hump. The inertness of boron may occur in other regions of the semiconductor substrate 10 without being limited to the above boundaries.

In contrast, the semiconductor device of this embodiment has the insulating film 4 formed as a protective film between the conductive film 34 and the insulating film 5. This protects the surface of the conductive film 34 and prevents the decomposition reaction of ammonia by the conductive film 34, thereby preventing the generation of hydrogen. The prevention of the generation of hydrogen can reduce hydrogen that moves to the semiconductor substrate 10 due to heating during the film formation of the insulating film 5 to prevent the generation of humps. This can prevent variations in the threshold voltage of the field-effect transistor to achieve the high reliability of the semiconductor device.

Second Embodiment

Figure 14:
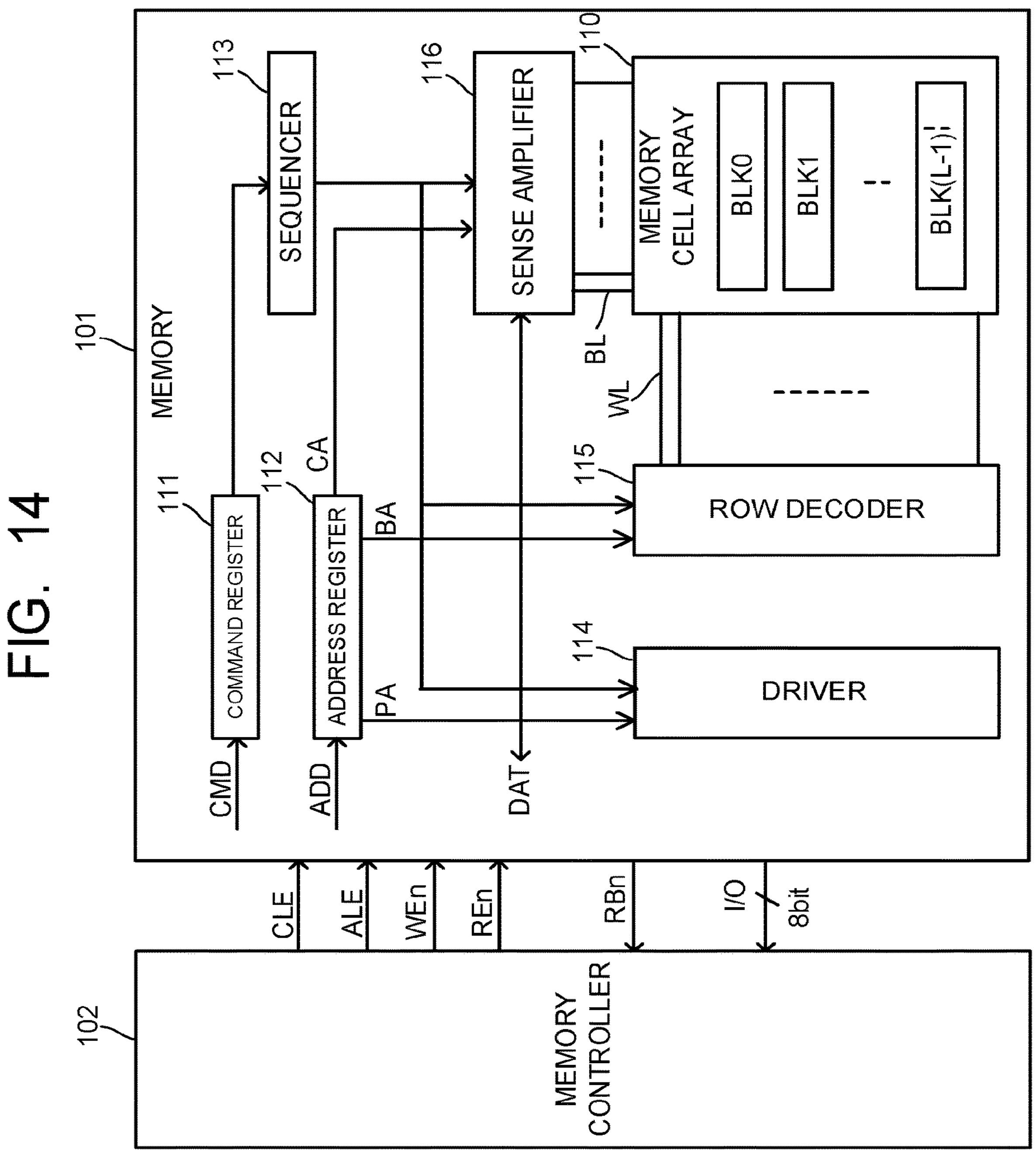
FIG. 14 is a block diagram illustrating a configuration example of a semiconductor memory device.

The semiconductor device of the first embodiment is applicable to a semiconductor memory device. FIG. 14 is a block diagram illustrating a configuration example of a semiconductor memory device. The semiconductor memory device includes a memory 101 and a memory controller 102.

The memory 101 includes a memory cell array 110, a command register 111, an address register 112, a sequencer 113, a driver 114, a row decoder 115, and a sense amplifier 116.

The memory cell array 110 includes a plurality of blocks BLK (BLK0 to BLK(L−1) (L is a natural number of 2 or more)). The block BLK is a set of a plurality of memory transistors MT that store data in a non-volatile manner.

The memory cell array 110 is connected to the sense amplifier 116 through a plurality of bit lines BL. The memory cell array 110 includes a plurality of word lines WL and is connected to the row decoder 115 through the word lines WL, as described below. Each memory transistor MT (memory cell) is connected to one of the plurality of word lines WL and one of the plurality of bit lines BL.

The command register 111 holds a command signal CMD received from the memory controller 102. The command signal CMD includes, for example, command data that causes the sequencer 113 to execute read, write, and erase operations.

The address register 112 holds an address signal ADD received from the memory controller 102. The address signal ADD includes, for example, a block address BA, a page address PA, and a column address CA. For example, the block address BA, the page address PA, and the column address CA are used to select the block BLK, the word line WL, and the bit line BL, respectively.

The sequencer 113 controls operation of the memory 101. The sequencer 113 controls the driver 114, the row decoder 115, the sense amplifier 116, and the like, based on the command signal CMD held in the command register 111, for example, to execute the operations such as the read, write, and erase operations.

The driver 114 generates voltages used in the read, write, erase, and other operations. The driver 114 then applies the generated voltage to the signal line corresponding to the selected word line WL based on the page address PA held in the address register 112, for example.

The row decoder 115 selects corresponding one block BLK in the memory cell array 110 based on the block address BA held in the address register 112. The row decoder 115 then transfers, for example, the voltage applied to the signal line corresponding to the selected word line WL to the selected word line WL in the selected block BLK.

In the write operation, the sense amplifier 116 applies a desired voltage to each bit line BL according to a write data DAT received from the memory controller 102. In the read operation, the sense amplifier 116 determines data stored in the memory cell based on the voltage of the bit line BL and transfers the determination result to the memory controller 102 as a read data DAT.

Communication between the memory 101 and the memory controller 102 supports, for example, a NAND interface standard. For example, the communication between the memory 101 and the memory controller 102 uses a command latch enable signal CLE, an address latch enable signal ALE, a write enable signal WEn, a read enable signal REn, a ready busy signal RBn, and an input/output signal I/O.

The command latch enable signal CLE indicates that the input/output signal I/O received by the memory 101 is the command signal CMD. The address latch enable signal ALE indicates that the input/output signal I/O received is the address signal ADD. The write enable signal WEn is a signal that commands the memory 101 to input the input/output signal I/O. The read enable signal REn is a signal that commands the memory 101 to output the input/output signal I/O.

The ready busy signal RBn is a signal that notifies the memory controller 102 whether the memory 101 is ready to accept commands from the memory controller 102 or busy not to accept commands.

The input/output signal I/O is, for example, an 8-bit wide signal and can include signals such as the command signal CMD, the address signal ADD, and the write data signal DAT.

The memory 101 and the memory controller 102 described above may be combined to form a single semiconductor memory device. Examples of such semiconductor memory devices include memory cards, such as SD cards, and solid-state drives (SSD), for example.

Figure 15:
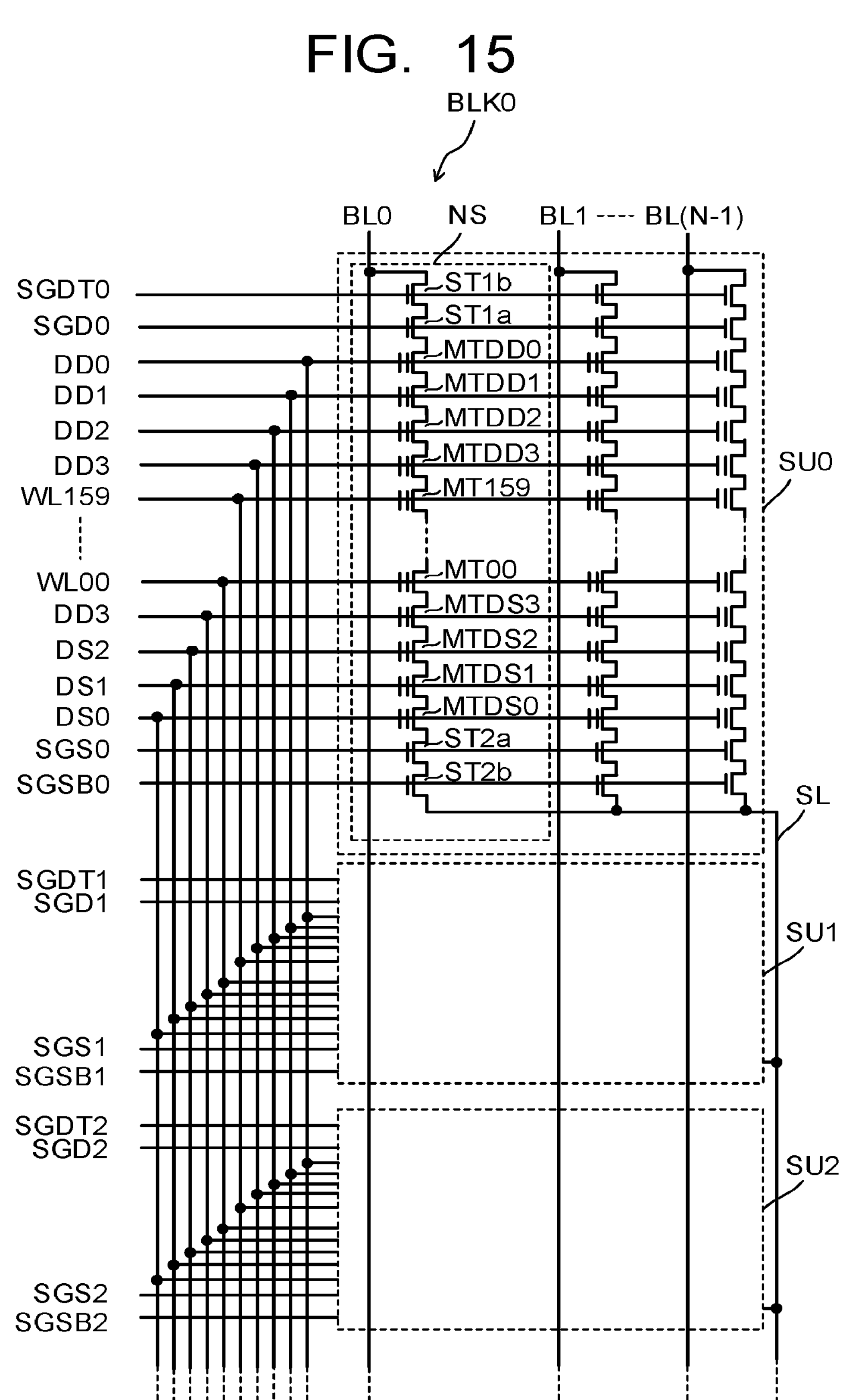
FIG. 15 is a circuit diagram illustrating circuitry of a memory cell array.

Next, an example of circuitry of the memory cell array 110 is described. FIG. 15 is a circuit diagram illustrating the circuitry of the memory cell array 110. FIG. 15 illustrates the block BLK0 as an example, but configurations of other blocks BLK are the same.

The block BLK includes a plurality of string units SU. Each string unit SU includes a plurality of NAND strings NS. Although FIG. 15 illustrates three string units SU (SU0 to SU2), the number of string units SU is not limited.

Each NAND string NS is connected to one of the plurality of bit lines BL (BL0 to BL(N−1) (N is a natural number of two or more)). Each NAND string NS includes the memory transistors MT, dummy memory transistors MTDD, dummy memory transistors MTDS, select transistors ST1, and select transistors ST2.

The memory transistor MT includes a control gate and a charge storage film and holds data in a non-volatile manner. FIG. 15 illustrates a plurality of memory transistors MT (MT00 to MT159), but the number of memory transistors MT is not limited.

The dummy memory transistors MTDD and MTDS each include a control gate and a charge storage film. The dummy memory transistors MTDD and MTDS have the same structure as that of the memory transistor MT but are not used to hold data.

The memory transistor MT, the dummy memory transistor MTDD, and the dummy memory transistor MTDS each may be a MONOS type using an insulating film for the charge storage film or an FG type using a conductive layer for the charge storage film. In the following, the MONOS type is described as an example in this embodiment.

The select transistor ST1 is used to select the string unit SU during various operations. FIG. 15 illustrates a plurality of select transistors ST1 (ST1*a*, ST1*b*), but the number of select transistors ST1 is not limited.

The select transistor ST2 is used to select the string unit SU during various operations. FIG. 15 illustrates a plurality of select transistors ST2 (ST2*a*, ST2*b*), but the number of select transistors ST2 is not limited.

In each NAND string NS, a drain of the select transistor ST1 is connected to the corresponding bit line BL. A source of the select transistor ST1 is connected to one end of the memory transistors MT connected in series. The other end of the memory transistors MT connected in series is connected to a drain of the select transistor ST2.

In the same block BLK, a source of the select transistor ST2 is connected to a source line SL. A gate of the select transistor ST1*a* in each string unit SU is connected to a corresponding select gate line SGD. A gate of the select transistor ST1*b* is connected to a corresponding select gate line SGDT. The control gate of each memory transistor MT is connected to the corresponding word line WL. The control gate of each dummy memory transistor MTDD is connected to a corresponding dummy word line DD. The control gate of each dummy memory transistor MTDS is connected to a corresponding dummy word line DS. A gate of the select transistor ST2*a* is connected to a corresponding select gate line SGS. A gate of the select transistor ST2*b* is connected to a corresponding select gate line SGSB.

The plurality of NAND strings NS with the same column address CA assigned are connected to the same bit line BL among the plurality of blocks BLK. The source line SL is connected among the plurality of blocks BLK.

Figure 16:
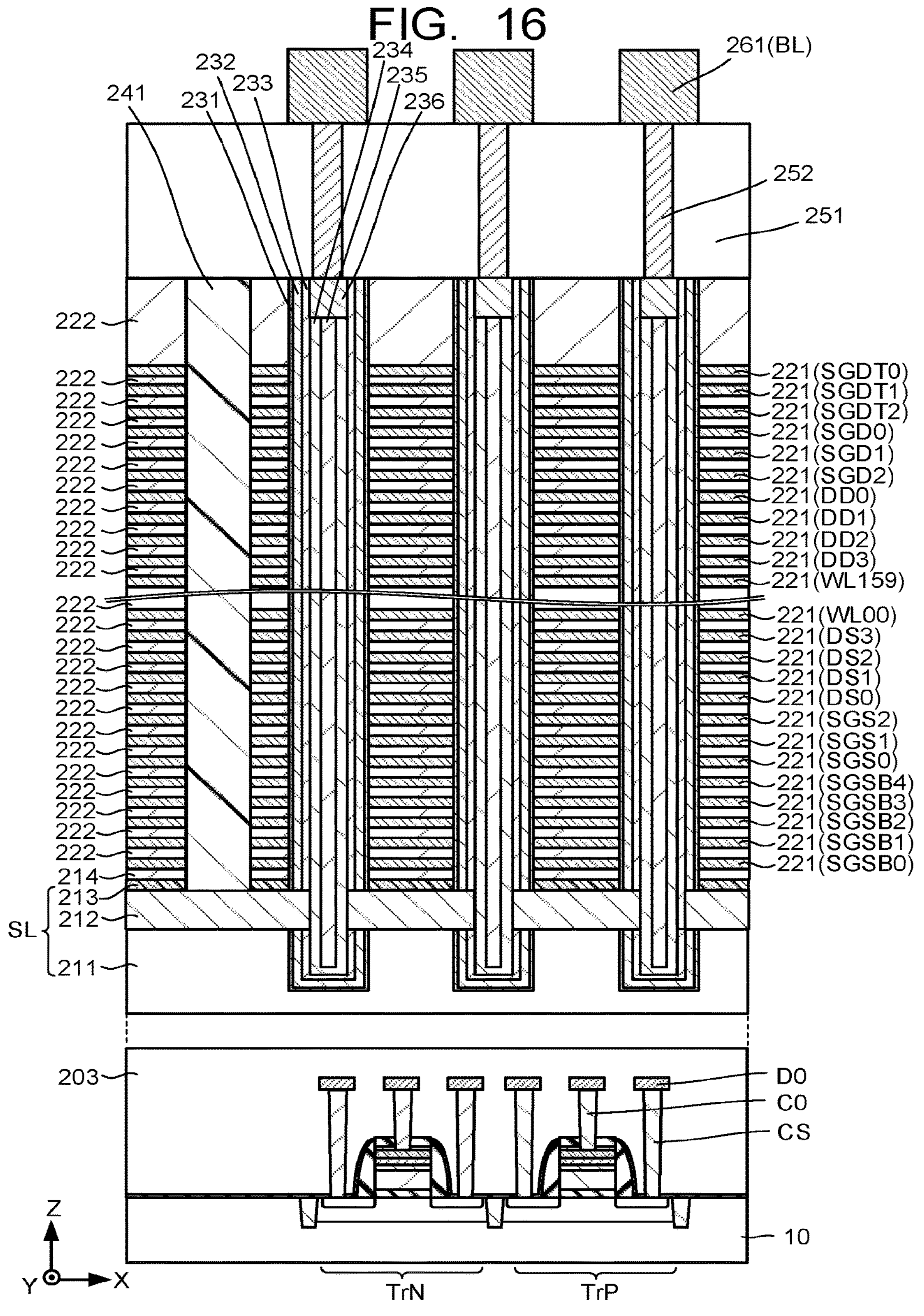
FIG. 16 is a cross-sectional schematic diagram for describing a cross-sectional structural example of the semiconductor memory device.

Next, a cross-sectional structural example of the semiconductor memory device will be described. FIG. 16 is a cross-sectional schematic diagram for describing the cross-sectional structural example of the semiconductor memory device, illustrating an X-axis direction along a surface of the semiconductor substrate 10, a Y-axis direction along the surface and almost perpendicular to the X-axis, and a Z-axis direction almost perpendicular to the surface. FIG. 16 illustrates a structure having peripheral circuits such as the command register 111, the address register 112, the sequencer 113, the driver 114, the row decoder 115, and the sense amplifier 116 below the memory cell array 110.

As illustrated in FIG. 16, the semiconductor memory device includes the field-effect transistors TrN and TrP provided at the semiconductor substrate 10, an insulating layer 203, a conductive layer 211, a conductive layer 212, a conductive layer 213, an insulating layer 214, conductive layers 221, insulating layers 222, block insulating films 231, charge storage films 232, tunnel insulating films 233, semiconductor layers 234, core insulating layers 235, cap layers 236, an insulating layer 241, an insulating layer 251, conductive layers 252, and conductive layers 261. The conductive layer 211, the conductive layer 212, the conductive layer 213, the insulating layer 214, the conductive layers 221, the insulating layers 222, the block insulating films 231, the charge storage films 232, the tunnel insulating films 233, the semiconductor layers 234, the core insulating layers 235, the cap layers 236, and the insulating layer 241 form the above memory cell array 110.

The field-effect transistors TrN and TrP are provided below the memory cell array 110. The field-effect transistor TrN is an N-channel field-effect transistor. The field-effect transistor TrP is a P-channel field-effect transistor. The field-effect transistor TrN and the field-effect transistor TrP respectively have the field-effect transistor TrN and the field-effect transistor TrP of the semiconductor device illustrated in FIG. 1. Each of the field-effect transistors TrN and TrP forms any of the above peripheral circuits. FIG. 16 illustrates the field-effect transistors TrN and TrP adjacent to each other for convenience, but the arrangement is not limited thereto. For example, the field-effect transistors TrN and TrP may be arranged apart from each other and other transistors or the like may be provided between them.

The contact plugs CS connect sources or drains of the field-effect transistors TrP and TrN to conductive layers D0. The contact plugs C0 connect gate electrodes of the field-effect transistors TrP and TrN to the conductive layers D0.

The insulating layer 203 covers the field-effect transistors TrP and TrN, and insulates between the field-effect transistors TrN and TrP, between the contact plugs C0 and CS, and between the conductive layers D0. The insulating layer 203 contains, for example, silicon oxide. The field-effect transistors TrN and TrP are connected to the memory cell array 110 through other wiring layers and contact plugs, but these are not illustrated here for convenience.

The conductive layers 211, 212, and 213 form the source line SL. Each of the conductive layers 211, 212, and 213 is a polysilicon layer containing doped phosphorus, for example. The conductive layer 212 is provided between the conductive layer 211 and the conductive layer 213 and is in contact with the semiconductor layer 234 penetrating through the block insulating film 231, the charge storage film 232, and the tunnel insulating film 233 along the X-axis direction. In this embodiment, electrical connection between the semiconductor layer (semiconductor layer 234) that forms a channel of the memory cell and the conductive layers that form the source line SL is formed at a side of the semiconductor layer 234, but other configurations, such that, the electrical connection between the semiconductor layer that forms the channel of the memory cell and the conductive layers that form the source line SL may be formed at a bottom surface of the semiconductor layer.

The insulating layer 214 is provided on the conductive layer 213. The insulating layer 214 contains, for example, silicon oxide.

The conductive layers 221 and the insulating layers 222 are alternately stacked to form a stack. The plurality of conductive layers 221 form select gate lines SGSB0 to SGSB4, select gate lines SGS0 to SGS2, dummy word lines DS0 to DS3, word lines WL00 to WL159, dummy word lines DD0 to DD3, select gate lines SGD0 to SGD2 and select gate lines SGDT0 to SGDT2. The conductive layer 221 contains a metal material. The insulating layer 222 contains, for example, silicon oxide.

The block insulating film 231, the charge storage film 232, the tunnel insulating film 233, the semiconductor layer 234, and the core insulating layer 235 form a memory pillar. Each component of the memory pillar extends along the Z-axis direction. One memory pillar corresponds to one NAND string NS.

The block insulating film 231, the tunnel insulating film 233, and the core insulating layer 235 contain, for example, silicon oxide. The charge storage film 232 contains, for example, silicon nitride. The semiconductor layer 234 and the cap layer 236 contain, for example, polysilicon.

More concretely, holes corresponding to the memory pillars are formed penetrating through the plurality of conductive layers 221. The block insulating film 231, the charge storage film 232, and the tunnel insulating film 233 are sequentially stacked on a side of each hole. The semiconductor layer 234 is then formed so that the side is in contact with the tunnel insulating film 233 and the conductive layer 212.

The semiconductor layer 234 has a channel formation region for the select transistors ST1, the select transistors ST2, the memory transistors MT, the dummy memory transistors MTDS, and the dummy memory transistors MTDD. Therefore, the semiconductor layer 234 functions as a signal line that connects current paths of the select transistors ST1, the select transistors ST2, the memory transistors MT, the dummy memory transistors MTDS, and the dummy memory transistors MTDD.

The core insulating layer 235 is provided inside the semiconductor layer 234.

The cap layer 236 is provided on the semiconductor layer 234 and the core insulating layer 235 and is also in contact with the tunnel insulating film 233.

The insulating layer 251 is provided on the stack of the conductive layers 221 and the insulating layers 222. The insulating layer 251 contains, for example, tetraethyl orthosilicate (TEOS). The conductive layer 252 forms the contact plug. The conductive layer 261 is in contact with the cap layer 236 through the conductive layer 252. The conductive layer 261 forms the bit line BL. The conductive layer 252 and the conductive layer 261 contain a metal material.

An intersection of the memory pillar and the conductive layer 221 that forms each word line WL functions as the memory transistor MT. An intersection of the memory pillar and the conductive layer 221 that forms each dummy word line DD functions as the dummy memory transistor MTDD. An intersection of the memory pillar and the conductive layer 221 that forms each dummy word line DS functions as the dummy memory transistor MTDS. An intersection of the memory pillar and the conductive layer 221 that forms each select gate line SGD functions as the select transistor ST1*a*. An intersection of the memory pillar and the conductive layer 221 that forms each select gate line SGDT functions as the select transistor ST1*b*. An intersection of the memory pillar and the conductive layer 221 that forms each select gate line SGS functions as the select transistor ST2*a*. An intersection of the memory pillar and the conductive layer 221 that forms each select gate line SGSB functions as the select transistor ST2*b*.

Figure 17:
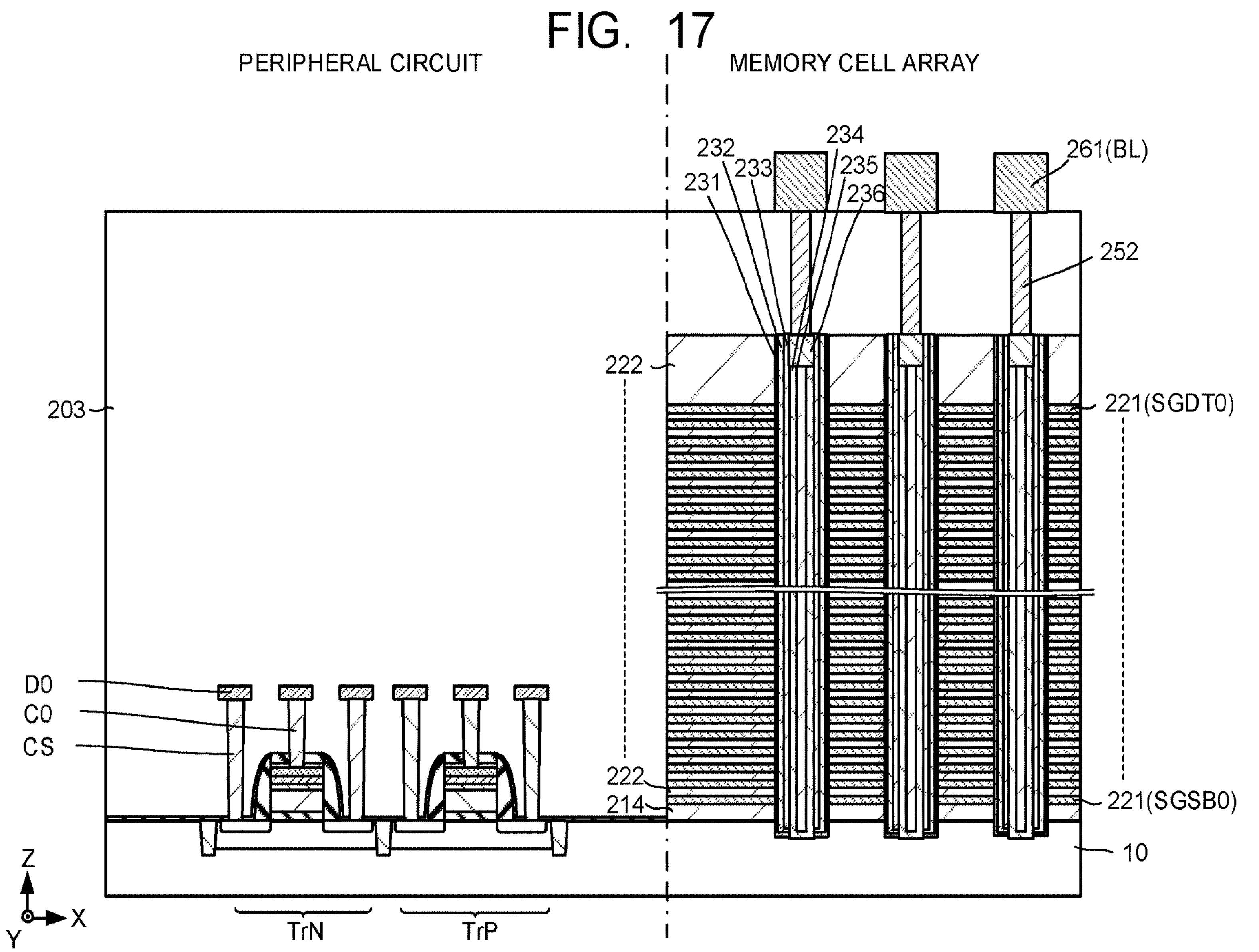
FIG. 17 is a cross-sectional schematic diagram for describing another cross-sectional structural example of the semiconductor memory device.

The structure of the semiconductor memory device is not limited to the structure illustrated in FIG. 16. FIG. 17 is a cross-sectional schematic diagram for describing another cross-sectional structural example of the semiconductor memory device, illustrating an X-axis direction along the surface of the semiconductor substrate 10, a Y-axis direction along the surface and almost perpendicular to the X-axis, and a Z-axis direction almost perpendicular to the surface. FIG. 17 illustrates a structure with peripheral circuits juxtaposed with the memory cell array 110, and a part of the region of the memory cell array and a part of the region of the peripheral circuits are illustrated.

As illustrated in FIG. 17, the semiconductor memory device includes the field-effect transistors TrP and TrN provided at the semiconductor substrate 10, the insulating layer 203, the insulating layer 214, the conductive layers 221, the insulating layers 222, the block insulating films 231, the charge storage films 232, the tunnel insulating films 233, the semiconductor layers 234, the core insulating layers 235, the cap layers 236, the insulating layer 241, an insulating layer 242, the conductive layers 252, and the conductive layers 261. Descriptions of the parts common to the components of the semiconductor memory device illustrated in FIG. 16 will be omitted.

In the semiconductor memory device illustrated in FIG. 17, the semiconductor layer 234 is in contact with the semiconductor substrate 10 penetrating through the block insulating film 231, the charge storage film 232, and the tunnel insulating film 233. The semiconductor layer 234 is connected to the source line SL, not illustrated, through the semiconductor substrate 10.

As described above, the semiconductor memory device of this embodiment can provide a semiconductor memory device with high reliability by applying the semiconductor device of the first embodiment to the peripheral circuits.

While certain embodiments have been described, these embodiments have been presented by way of example only, and are not intended to limit the scope of the inventions. Indeed, those embodiments may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:

a semiconductor substrate having a first region and a second region, each region containing a first-type impurity;

a first insulating layer provided on a region between the first region and the second region in the semiconductor substrate;

a first gate electrode having a first semiconductor layer provided on the first insulating layer and containing an impurity, a first conductive layer provided on the first semiconductor layer and containing titanium, a second conductive layer provided on the first conductive layer and containing nitrogen and either titanium or tungsten, and a third conductive layer provided on the second conductive layer and containing tungsten;

a second insulating layer provided on the third conductive layer and containing oxygen and silicon;

a third insulating layer provided on the second insulating layer and containing nitrogen and silicon;

a seventh insulating layer provided on a side surface of the first gate electrode and containing oxygen and silicon;

an eighth insulating layer provided on the seventh insulating layer to define a side wall together with the seventh insulating layer and containing nitrogen and silicon;

a first contact provided on the first region;

a second contact provided on the second region; and a third contact provided on the third conductive layer of the first gate electrode, the third contact penetrating through the second insulating layer and the third insulating layer, wherein a lower end of the third contact is closer to the semiconductor substrate than is an upper end of the side wall, and the lower end of the third contact is closer to the semiconductor substrate than are lower ends of both the second insulating layer and the third insulating layer.

2. The semiconductor device according to claim 1, wherein the second insulating layer is thinner than the third insulating layer.

3. The semiconductor device according to claim 1, wherein the second insulating layer is configured to prevent oxidation of the third conductive layer.

4. The semiconductor device according to claim 1, wherein the first semiconductor layer contains polysilicon doped with the first-type impurity.

5. The semiconductor device according to claim 1, wherein the semiconductor substrate has a third region and a fourth region, each region containing a second-type impurity, and the semiconductor device further comprises:

a fourth insulating layer provided on a region between the third region and the fourth region in the semiconductor substrate;

a second gate electrode having a second semiconductor layer provided on the fourth insulating layer and containing a second impurity, a fourth conductive layer provided on the second semiconductor layer and containing titanium, a fifth conductive layer provided on the fourth conductive layer and containing nitrogen and either titanium or tungsten, and a sixth conductive layer provided on the fifth conductive layer and containing tungsten;

a fifth insulating layer provided on the sixth conductive layer and containing oxygen and silicon;

a sixth insulating layer provided on the fifth insulating layer and containing nitrogen and silicon;

a fourth contact provided on the third region;

a fifth contact provided on the fourth region; and a sixth contact provided on the sixth conductive layer of the second gate electrode, the sixth contact penetrating through the fifth insulating layer and the sixth insulating layer.

6. The semiconductor device according to claim 5, wherein the fifth insulating layer is thinner than the sixth insulating layer.

7. The semiconductor device according to claim 5, wherein the fifth insulating layer is configured to prevent oxidation of the sixth conductive layer.

8. The semiconductor device according to claim 5, wherein the second semiconductor layer contains polysilicon doped with the second-type impurity.

9. A semiconductor memory device, comprising:

a memory cell array; and a peripheral circuit having the semiconductor device according to claim 1, wherein the memory cell array comprises:

a plurality of seventh conductive layers, each being stacked in one direction, a semiconductor layer extending in the one direction, and a plurality of memory cells provided between the plurality of seventh conductive lavers and the semiconductor layer and containing nitrogen and silicon; and the memory cell array is provided above the first region and the second region.

* * * * *